United States Patent
Kwak et al.

(10) Patent No.: US 11,824,006 B2
(45) Date of Patent: Nov. 21, 2023

(54) SEMICONDUCTOR PACKAGE

(71) Applicant: SAMSUNG ELECTRONICS CO., LTD., Suwon-si (KR)

(72) Inventors: Byoung-Soo Kwak, Hwaseong-si (KR); Ji-Seok Hong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 108 days.

(21) Appl. No.: 17/492,788

(22) Filed: Oct. 4, 2021

(65) Prior Publication Data
US 2022/0122918 A1    Apr. 21, 2022

(30) Foreign Application Priority Data
Oct. 21, 2020    (KR) ................... 10-2020-0136769

(51) Int. Cl.
| | | |
|---|---|---|
| *H01L 25/065* | (2023.01) | |
| *H01L 23/31* | (2006.01) | |
| *H01L 23/538* | (2006.01) | |

(52) U.S. Cl.
CPC .......... *H01L 23/5384* (2013.01); *H01L 23/31* (2013.01); *H01L 23/5386* (2013.01); *H01L 25/0655* (2013.01)

(58) Field of Classification Search
CPC . H01L 23/5384; H01L 23/31; H01L 23/8386; H01L 25/0655; H01L 24/80; H01L 2225/06548; H01L 2225/0657; H01L 2224/08145; H01L 2224/16145; H10B 80/00
See application file for complete search history.

(56) References Cited

U.S. PATENT DOCUMENTS

| | | | |
|---|---|---|---|
| 9,666,559 B2 | 5/2017 | Wang et al. | |
| 10,141,361 B2 | 11/2018 | Umebayashi et al. | |
| 10,269,586 B2 * | 4/2019 | Chou | ............ H01L 24/19 |
| 10,573,600 B2 | 2/2020 | Chi et al. | |
| 2013/0051116 A1 | 2/2013 | En et al. | |
| 2017/0092617 A1 * | 3/2017 | Wu | ............ H01L 24/06 |
| 2018/0005984 A1 | 1/2018 | Yu et al. | |

* cited by examiner

*Primary Examiner* — Timor Karimy
(74) *Attorney, Agent, or Firm* — F. Chau & Associates, LLC

(57) ABSTRACT

A semiconductor package includes a first semiconductor chip having a first face and a second face opposite thereto. The first semiconductor chip includes a first wiring layer having a surface that forms the first face. A second semiconductor chip disposed on the first face of the first semiconductor chip includes a second wiring layer directly contacting the first wiring layer. A first mold layer is disposed on one lateral side of the first semiconductor chip and directly contacts the second wiring layer. A first via penetrates the first mold layer. A width of the first wiring layer and the first semiconductor chip in a horizontal direction are substantially the same. A width of the second wiring layer and the second semiconductor chip in the horizontal direction are substantially the same. A height of the first via and the first semiconductor chip in the vertical direction are substantially the same.

20 Claims, 15 Drawing Sheets

SEMICONDUCTOR PACKAGE

CROSS-REFERENCE TO RELATED APPLICATION

This application claims priority under 35 U.S.C. § 119 to Korean Patent Application No. 10-2020-0136769, filed on Oct. 21, 2020 in the Korean Intellectual Property Office, the disclosure of which is incorporated by reference in its entirety herein.

1. Technical Field

The present inventive concepts relate to a semiconductor package.

2. Discussion of Related Art

As a demand for high-performance electronic devices has increased, the sizes of a semiconductor chip and a semiconductor package applied thereto have also increased. In contrast, the thickness of the semiconductor package may decrease due to the demand for relatively slim electronic devices.

Semiconductor packages are developed to provide multi-functionality, high capacity and miniaturization. Therefore, by integrating a plurality of semiconductor chips into a single semiconductor package, it is possible to execute high capacity and multi-functions, while significantly reducing the size of the semiconductor package.

SUMMARY

Aspects of the present inventive concepts provide a semiconductor package in which a wiring layer of an upper semiconductor chip and a wiring layer of a lower semiconductor chip are directly joined, and a mold layer and a via are formed on one side of the lower semiconductor chip to effectively release internal heat to the outside.

Aspects of the present inventive concepts also provide a semiconductor package in which a wiring layer of an upper semiconductor chip and a wiring layer of a lower semiconductor chip are directly joined and electrically connected, and a mold layer and a via are formed on one side of the lower semiconductor chip to omit a process of forming another via inside the lower semiconductor chip, thereby reducing the fabricating cost.

According to an embodiment of the present inventive concepts, a semiconductor package includes a first semiconductor chip having a first face and a second face opposite to the first face in a vertical direction. The first semiconductor chip includes a first wiring layer having a surface that forms the first face. A second semiconductor chip is disposed on the first face of the first semiconductor chip. The second semiconductor chip includes a second wiring layer in direct contact with the first wiring layer. A first mold layer is disposed on one lateral side of the first semiconductor chip. The first mold layer directly contacts the second wiring layer. A first via penetrates the first mold layer in the vertical direction. A width of the first wiring layer in a horizontal direction is substantially the same as a width of the first semiconductor chip in the horizontal direction. A width of the second wiring layer in the horizontal direction is substantially the same as a width of the second semiconductor chip in the horizontal direction. A height of the first via in the vertical direction is substantially the same as a height of the first semiconductor chip in the vertical direction.

According to an embodiment of the present inventive concepts, a semiconductor package includes a first semiconductor chip having a first face and a second face opposite to the first face in a vertical direction. The first semiconductor chip includes a first wiring layer having a surface that forms the first face. A second semiconductor chip is disposed on the first face of the first semiconductor chip. The second semiconductor chip includes a second wiring layer in direct contact with the first wiring layer. A first mold layer is disposed on one lateral side of the first semiconductor chip. The first mold layer has a first face in direct contact with the second wiring layer and a second face opposite to the first face in the vertical direction. A first via penetrates the first mold layer in the vertical direction. A width of the first wiring layer in a horizontal direction is substantially the same as a width of the first semiconductor chip in the horizontal direction. A width of the second wiring layer in the horizontal direction is substantially the same as a width of the second semiconductor chip in the horizontal direction. A height of the first mold layer in the vertical direction is substantially the same as a height of the first semiconductor chip in the vertical direction. The second face of the first mold layer is positioned on a same plane as the second face of the first semiconductor chip.

According to an embodiment of the present inventive concepts, a semiconductor package includes a first semiconductor chip having a first face and a second face opposite to the first face. The first semiconductor chip includes a first wiring layer having a surface that forms the first face. A second semiconductor chip is disposed on the first face of the first semiconductor chip. The second semiconductor chip includes a second wiring layer that directly contacts the first wiring layer. A mold layer is disposed on one lateral side of the first semiconductor chip. The mold layer has a first face that directly contacts the second wiring layer, and a second face opposite to the first face. A via penetrates the mold layer in a vertical direction. A solder ball is disposed on the second face of the mold layer and is electrically connected to the via. A width of the first wiring layer in a horizontal direction is substantially the same as a width of the first semiconductor chip in the horizontal direction. A width of the second wiring layer in the horizontal direction is substantially the same as a width of the second semiconductor chip in the horizontal direction. A height of the via in the vertical direction is substantially same as a height of the first semiconductor chip in the vertical direction. A height of the mold layer in the vertical direction is substantially the same as the height of the first semiconductor chip in the vertical direction. The second face of the mold layer is positioned on a same plane as the second face of the first semiconductor chip. A first side wall of the mold layer directly contacts the first semiconductor chip, and a second side wall of the mold layer opposite to the first side wall of the mold layer is aligned with a side wall of the second semiconductor chip.

However, embodiments of the present inventive concepts are not limited thereto. The above and other aspects of the present inventive concepts will become more apparent to one of ordinary skill in the art to which the present inventive concepts pertain by referencing the detailed description of embodiments given below.

BRIEF DESCRIPTION OF THE DRAWINGS

The above and other aspects and features of the present disclosure will become more apparent by describing in detail embodiments thereof referring to the attached drawings, in which.

DETAILED DESCRIPTION OF EMBODIMENTS

Hereinafter, a semiconductor package according to embodiments of the present inventive concepts will be described referring to FIG. 1.

Figure 1:
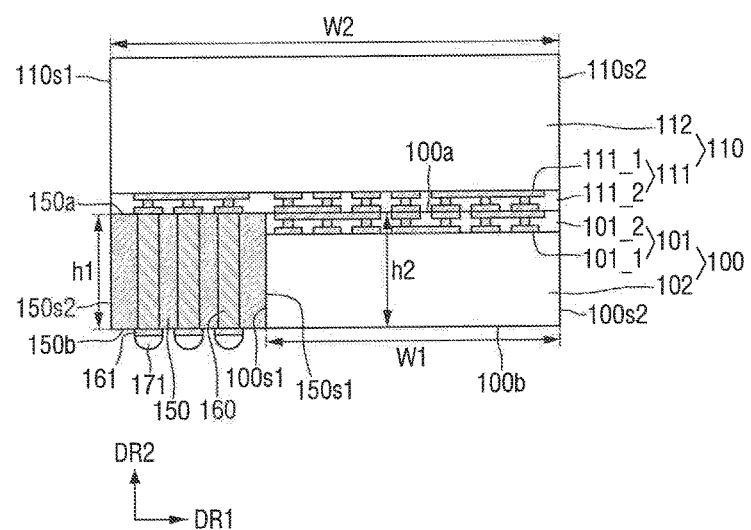
FIG. 1 is a cross-sectional view of a semiconductor package according to an embodiment of the present inventive concepts.

FIG. 1 is a cross-sectional view for explaining a semiconductor package according to an embodiment of the present inventive concepts.

Referring to FIG. 1, the semiconductor package according to an embodiment of the present inventive concepts includes a first semiconductor chip 100, a second semiconductor chip 110, a first mold layer 150, a first via 160, a first conductive pad 161, and a first solder ball 171.

In an embodiment, each of the first semiconductor chip 100 and the second semiconductor chip 110 may be a volatile memory semiconductor chip, such as a DRAM (Dynamic Random Access Memory) or an SRAM (Static Random Access Memory), or a non-volatile memory semiconductor chip such as a PRAM (Phase-change Random Access Memory), a MRAM (Magnetoresistive Random Access Memory), a FeRAM (Ferroelectric Random Access Memory) or a RRAM (Resistive Random Access Memory). However, embodiments of the present inventive concepts are not limited thereto.

For example, in some embodiments, each of the first semiconductor chip 100 and the second semiconductor chip 110 may be a memory package including a plurality of memory semiconductor chips. However, embodiments of the present inventive concepts are not limited thereto.

The first semiconductor chip 100 may include a first face 100a, and a second face 100b opposite to the first face 100a.

For example, as shown in the embodiment of FIG. 1, the first face 100a and the second face 100b may be opposite to each other in a vertical direction DR2 which is a thickness direction of the first semiconductor chip 100. However, the vertical direction DR2 is relative and may extend in various different directions depending on the orientation of the device. For example, the first face 100a of the first semiconductor chip 100 may be an upper face of the first semiconductor chip 100, and the second face 100b of the first semiconductor chip 100 may be a lower face of the first semiconductor chip 100. However, embodiments of the present inventive concepts are not limited thereto. As shown in the embodiment of FIG. 1, the first semiconductor chip 100 may include a first side wall 100s1, and a second side wall 100s2 opposite to the first side wall 100s1. For example, the first side wall 100s1 may be opposite to the second side wall 100s2 in a horizontal direction DR1 which crosses the vertical direction DR2. For example, in an embodiment, the horizontal direction DR1 may be perpendicular to the vertical direction DR2. However, embodiments of the present inventive concepts are not limited thereto. Additionally, the horizontal direction DR1 is relative and may extend in various different directions depending on the orientation of the device.

The first semiconductor chip 100 may include a first wiring layer 101 and a first semiconductor layer 102. As shown in the embodiment of FIG. 1, a lower surface of the first wiring layer 101 may directly contact an upper surface of the first semiconductor layer 102. For example, the upper face of the first wiring layer 101 may be defined as being the same as the first face 100a of the first semiconductor chip 100. In an embodiment, the first semiconductor layer 102 may include a transistor.

The first wiring layer 101 may include a plurality of first wirings 101_1, and a first insulating layer 101_2 surrounding the plurality of first wirings 101_1. At least a partial portion of the plurality of first wirings 101_1 may be exposed to the first face 100a of the first semiconductor chip 100.

A width W1 of the first wiring layer 101 in the horizontal direction DR1 may be substantially the same as a width W1 of the first semiconductor chip 100 in the horizontal direction DR1. For example, the first wiring layer 101 may completely overlap the first semiconductor chip 100 in the vertical direction DR2.

The second semiconductor chip 110 may be disposed on the first face 100a of the first semiconductor chip 100. The second semiconductor chip 110 may include a first side wall 110s1, and a second side wall 110s2 opposite to the first side wall 110s1 (e.g., in the horizontal direction DR1). The second semiconductor chip 110 may include a second wiring layer 111 and a second semiconductor layer 112. The second semiconductor layer 112 may include a transistor.

As shown in the embodiment of FIG. 1, the second wiring layer 111 may be in direct contact with the first wiring layer 101. The second wiring layer 111 may include a plurality of second wirings 111_1, and a second insulating layer 111_2 surrounding the plurality of second wirings 111_1.

At least a partial portion of the plurality of second wirings 111_1 may be exposed on the lower face of the second semiconductor chip 110. At least a partial portion of the plurality of second wirings 111_1 may be in direct contact with the plurality of first wirings 101_1. For example, the plurality of second wirings 111_1 may be electrically connected to the plurality of first wirings 101_1 without any additional elements therebetween.

A width W2 of the second wiring layer 111 in the horizontal direction DR1 may be substantially the same as a width W2 of the second semiconductor chip 110 in the horizontal direction DR1. For example, the second wiring layer 111 may completely overlap the second semiconductor chip 110 in the vertical direction DR2.

As shown in the embodiment of FIG. 1, the width W2 of the second semiconductor chip 110 in the horizontal direction DR1 may be greater than the width W1 of the first semiconductor chip 100 in the horizontal direction DR1. For example, the width W2 of the second wiring layer 111 in the horizontal direction DR1 may be greater than the width W1 of the first wiring layer 101 in the horizontal direction DR1.

At least a partial portion of the second semiconductor chip 110 may protrude laterally from the first side wall 100s1 of the first semiconductor chip 100. For example, at least a partial portion of the second semiconductor chip 110 may not overlap the first semiconductor chip 100 in the vertical direction DR2

As shown in the embodiment of FIG. 1, the second side wall 100s2 of the first semiconductor chip 100 may be aligned with the second side wall 110s2 of the second semiconductor chip 110 in the vertical direction DR2. However, embodiments of the present inventive concepts are not limited thereto. For example, in some embodiments, at least a partial portion of the second side wall 110s2 of the second semiconductor chip 110 may laterally protrude from the second side wall 100s2 of the first semiconductor chip 100.

The first mold layer 150 may be disposed on one side (e.g., a lateral side) of the first semiconductor chip 100. For example, the first mold layer 150 may be disposed on the first side wall 100s1 of the first semiconductor chip 100. The first mold layer 150 may include a first face 150a, and a second face 150b opposite to the first face 150a. For example, as shown in the embodiment of FIG. 1, the first face 150a and the second face 150b may be opposite to each other in the vertical direction DR2 and the first face 150a of the first mold layer 150 may be defined as the upper face of the first mold layer 150, and the second face 150b of the first mold layer 150 may be defined as the lower face of the first mold layer 150. Further, the first mold layer 150 may include a first side wall 150s1, and a second side wall 150s2 opposite to the first side wall 150s1 (e.g., in the horizontal direction DR1).

The first face 150a of the first mold layer 150 may be in direct contact with the second wiring layer 111 of the second semiconductor chip 110. The first side wall 150s1 of the first mold layer 150 may be in direct contact with the first side wall 100s1 of the first semiconductor chip 100.

As shown in the embodiment of FIG. 1, the second side wall 150s2 of the first mold layer 150 may be aligned with the first side wall 110s1 of the second semiconductor chip 110 in the vertical direction DR2. The second face 150b of the first mold layer 150 may be formed on the same plane as the second face 100b of the first semiconductor chip 100. A height h1 of the first mold layer 150 (e.g., length in the vertical direction DR2) may be substantially the same as the height h2 (e.g., length in the vertical direction DR2) of the first semiconductor chip 100.

In an embodiment, the first mold layer 150 may include an epoxy molding compound (EMC) or two or more kinds of silicone hybrid materials. However, embodiments of the present inventive concepts are not limited thereto.

The first via 160 may penetrate the first mold layer 150 in the vertical direction DR2. The first via 160 may extend from the first face 150a of the first mold layer 150 to the second face 150b of the first mold layer 150. For example, the first via 160 may be exposed to each of the first face 150a of the first mold layer 150 and the second face 150b of the first mold layer 150.

The height h1 of the first via 160 in the vertical direction DR2 may be substantially the same as the height h1 of the first mold layer 150 in the vertical direction DR2. Further, the height h1 of the first via 160 (e.g., length in the vertical direction DR2) may be substantially the same as the height h2 of the first semiconductor chip 100 (e.g., length in the vertical direction DR2).

The first via 160 may include a conductive material. Although FIG. 1 shows that the first via 160 is formed of a single film, embodiments of the present inventive concepts are not limited thereto. For example, in some embodiments, the first via 160 may be formed of multi-films.

The first conductive pad 161 may be disposed on the second face 150b of the first mold layer 150. The first conductive pad 161 may overlap the first via 160 in the vertical direction DR2. The first conductive pad 161 may be electrically connected to the first via 160. The first conductive pad 161 may include a conductive material.

The first solder ball 171 may be disposed on the second face 150b of the first mold layer 150. The first solder ball 171 may be in direct contact with the first conductive pad 161. As shown in the embodiment of FIG. 1, the first solder ball 171 may protrude convexly from the first conductive pad 161. However, embodiments of the present inventive concepts are not limited thereto. The first solder ball 171 may be a portion by which the semiconductor package is electrically connected to another external element.

In an embodiment, the first solder ball 171 may include at least one compound selected from tin (Sn), indium (In), lead (Pb), zinc (Zn), nickel (Ni), gold (Au), silver (Ag), copper (Cu), antimony (Sb), bismuth (Bi), and combinations thereof. However, embodiments of the present inventive concepts are not limited thereto.

In the semiconductor package according to an embodiment of the present inventive concepts, since the first mold layer 150 is formed to be in direct contact with the first side wall 100s1 of the first semiconductor chip 100 and the lower face of the second semiconductor chip 110, the second side wall 100s2 of the first semiconductor chip 100, the second face 100b of the first semiconductor chip 100, the first side wall 110s1 of the second semiconductor chip 110, the second side wall 110s2 of the second semiconductor chip 110, and the upper face of the second semiconductor chip 110 may each be exposed to the outside. The heat inside the semiconductor package may be effectively released to the outside accordingly.

Further, in the semiconductor package according to an embodiment of the present inventive concepts, since the first wiring layer 101 of the first semiconductor chip 100 and the second wiring layer 111 of the second semiconductor chip 110 are disposed in direct contact with each other and are electrically connected to each other, and the first via 160 is formed inside the first mold layer 150 formed on one side (e.g., a lateral side) of the first semiconductor chip 100, a process of forming another via inside the first semiconductor chip 100 may be omitted to reduce the manufacturing cost.

Hereinafter, a semiconductor package according to an embodiment of the present inventive concepts will be described referring to FIG. 2. Differences from the semiconductor package shown in FIG. 1 will be mainly described and a repeated description of similar elements will be omitted for convenience of explanation.

Figure 2:
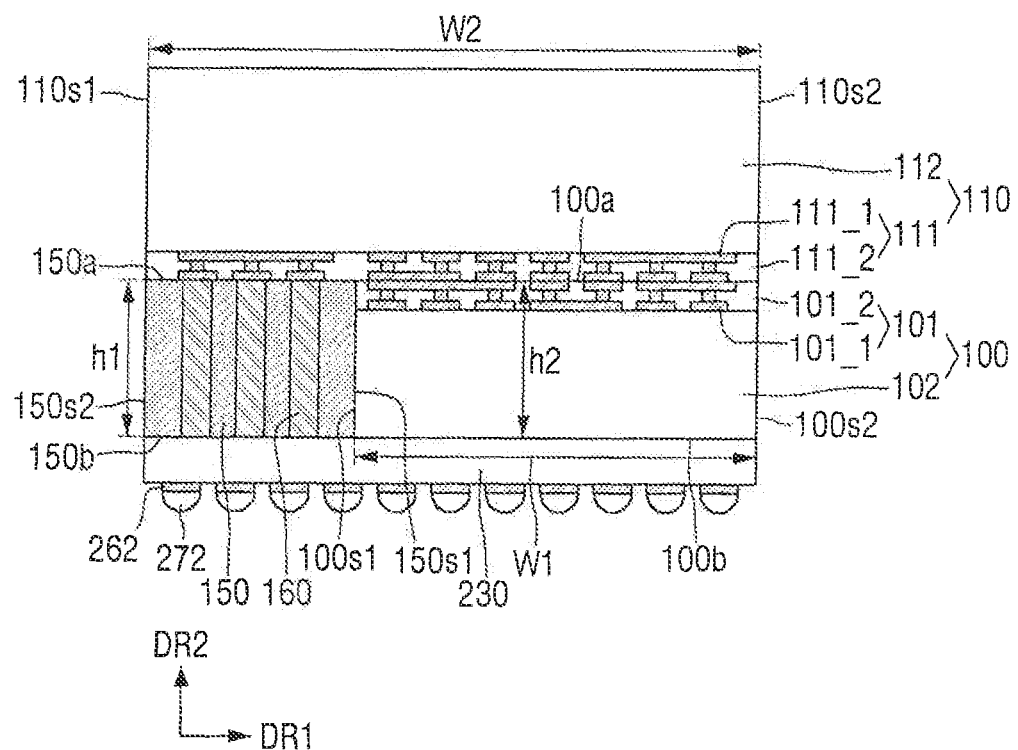
FIG. 2 is a cross-sectional view of a semiconductor package according to an embodiment of the present inventive concepts.

FIG. 2 is a cross-sectional view of a semiconductor package according to an embodiment of the present inventive concepts.

Referring to FIG. 2, in the semiconductor package according to an embodiment of the present inventive concepts, a substrate 230 may be disposed on the second face 100b of the first semiconductor chip 100.

The substrate 230 may be in direct contact with each of the second face 100b of the first semiconductor chip 100 and the second face 150b of the first mold layer 150. The substrate 230 may be electrically connected to the second semiconductor chip 110 through the first via 160.

In an embodiment, the substrate 230 may be a printed circuit board (PCB) or a ceramic substrate. However, embodiments of the present inventive concepts are not limited thereto.

In an embodiment in which the substrate 230 is a printed circuit board, the substrate 230 may be composed of at least one material selected from phenolic resin, epoxy resin, and polyimide. For example, the substrate 230 may include at least one material selected from FR4, tetrafunctional polymer, polyphenylene ether, epoxy/polyphenylene oxide, BT (bismaleimide triazine), thermount, cyanate ester, a polyimide, and a liquid crystal polymer. Although the surface of the substrate 230 may be covered with a solder resist, embodiments of the present inventive concepts are not limited thereto.

The second conductive pad 262 may be disposed on the lower face of the substrate 230. The second conductive pad 262 may include a conductive material.

The second solder ball 272 may be disposed on the lower face of the substrate 230. As shown in the embodiment of FIG. 2, the second solder ball 272 may be in direct contact with the second conductive pad 262. The second solder ball 272 may protrude convexly from the second conductive pad 262. The second solder ball 272 may be a portion by which the semiconductor package is electrically connected to another external element.

In an embodiment, the second solder ball 272 may include at least one compound selected from tin (Sn), indium (In), lead (Pb), zinc (Zn), nickel (Ni), gold (Au), silver (Ag), copper (Cu), antimony (Sb), bismuth (Bi), and combinations thereof, embodiments of the present inventive concepts are not limited thereto.

Hereinafter, a semiconductor package according to an embodiment of the present inventive concepts will be described referring to FIG. 3. Differences from the semiconductor package shown in FIG. 1 will be mainly described and a repeated description of similar elements will be omitted for convenience of explanation.

Figure 3:
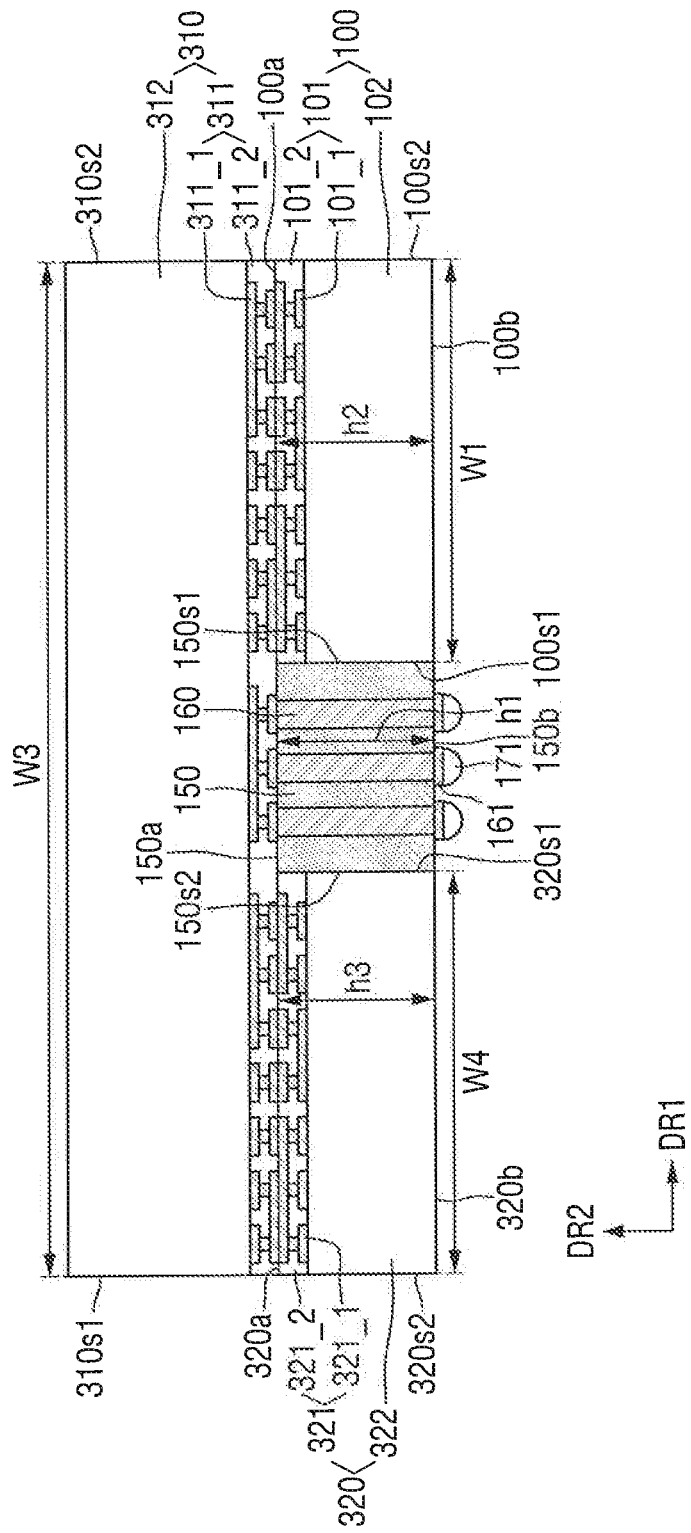
FIG. 3 is a cross-sectional view of a semiconductor package according to an embodiment of the present inventive concepts.

FIG. 3 is a cross-sectional view of a semiconductor package according to an embodiment of the present inventive concepts.

Referring to FIG. 3, in the semiconductor package according to an embodiment of the present inventive concepts, two semiconductor chips may be disposed on the lower face of the second semiconductor chip 310.

The second semiconductor chip 310 may be disposed on the first face 100a of the first semiconductor chip 100. The second semiconductor chip 310 may include a first side wall 310s1, and a second side wall 310s2 opposite to the first side wall 310s1 (e.g., in the horizontal direction DR1). The second semiconductor chip 310 may include a second wiring layer 311 and a second semiconductor layer 312. In an embodiment, the second semiconductor layer 312 may include a transistor.

As shown in the embodiment of FIG. 3, the second wiring layer 311 may be in direct contact with the first wiring layer 101. The second wiring layer 311 may include a plurality of second wirings 311_1, and a second insulating layer 311_2 surrounding the plurality of second wirings 311_1. The plurality of second wirings 311_1 may be electrically connected to the plurality of first wirings 101_1 without any additional elements therebetween.

A width W3 of the second wiring layer 311 in the horizontal direction DR1 may be substantially the same as a width W3 of the second semiconductor chip 310 in the horizontal direction DR1. For example, the second wiring layer 311 may completely overlap the second semiconductor chip 310 in the vertical direction DR2.

The width W3 of the second semiconductor chip 310 in the horizontal direction DR1 may be greater than the width W1 of the first semiconductor chip 100 in the horizontal direction DR1. For example, the width W3 of the second wiring layer 311 in the horizontal direction DR1 may be greater than the width W1 of the first wiring layer 101 in the horizontal direction DR1.

The third semiconductor chip 320 may be disposed on the lower face of the second semiconductor chip 310. The third semiconductor chip 320 may be spaced apart from the first semiconductor chip 100 in the horizontal direction DR1.

The third semiconductor chip 320 may include a first face 320a, and a second face 320b opposite to the first face 320a (e.g., in the vertical direction DR2). In the embodiment of FIG. 1, the first face 320a of the third semiconductor chip 320 is the upper face of the third semiconductor chip 320, and the second face 320b of the third semiconductor chip 320 is the lower face of the third semiconductor chip 320. However, embodiments of the present inventive concepts are not limited thereto. Further, the third semiconductor chip 320 may include a first side wall 320s1, and a second side wall 320s2 opposite to the first side wall 320s1 (e.g., in the horizontal direction DR1).

The third semiconductor chip 320 may include a third wiring layer 321 and a third semiconductor layer 322. In an embodiment, the third semiconductor layer 322 may include a transistor. For example, the upper face of the third wiring layer 321 may form and be defined as the same as the first face 320a of the third semiconductor chip 320.

The third wiring layer 321 may be in direct contact with the second wiring layer 311. The third wiring layer 321 may include a plurality of third wirings 321_1, and a third insulating layer 321_2 surrounding the plurality of third wirings 321_1. The plurality of third wirings 321_1 may be electrically connected to the plurality of second wirings 311_1 without any additional elements therebetween.

A width W4 of the third wiring layer 321 in the horizontal direction DR1 may be substantially the same as a width W4 of the third semiconductor chip 320 in the horizontal direction DR1. For example, the third wiring layer 321 may completely overlap the third semiconductor chip 320, such as the third semiconductor layer 322, in the vertical direction DR2. The width W4 of the third semiconductor chip 320 in the horizontal direction DR1 may be smaller than the width W3 of the second semiconductor chip 310 in the horizontal direction DR1.

The second side wall 100s2 of the first semiconductor chip 100 may be aligned with the second side wall 310s2 of the second semiconductor chip 310 in the vertical direction DR2. The second side wall 320s2 of the third semiconductor chip 320 may be aligned with the first side wall 310s1 of the second semiconductor chip 310 in the vertical direction DR2.

The first mold layer 150 may be disposed between the first semiconductor chip 100 and the third semiconductor chip 320 (e.g., in the horizontal direction DR1). As shown in the embodiment of FIG. 3, the first mold layer 150 may be in direct contact with each of the first side wall 100s1 of the first semiconductor chip 100 and the first side wall 320s1 of the third semiconductor chip 320. In an embodiment, the first face 150a, which is the upper face of the first mold layer 150, may be in direct contact with the second wiring layer 311 of the second semiconductor chip 310. For example, the first face 150a of the first mold layer 150 may be in direct contact with a lower surface of the second wiring layer 311 of the second semiconductor chip 310.

The second face 150b, which is the lower face of the first mold layer 150, may be positioned on the same plane as each of the second face 100b of the first semiconductor chip 100 and the second face 320b of the third semiconductor chip 320. The height h1 of the first mold layer 150 in the vertical direction DR2 may be substantially the same as each of the height h2 of the first semiconductor chip 100 in the vertical direction DR2 and the height h3 of the third semiconductor chip 320 in the vertical direction DR2.

The first via 160 may be disposed between the first semiconductor chip 100 and the third semiconductor chip 320 (e.g., in the horizontal direction DR1). The first via 160 may penetrate the first mold layer 150 in the vertical direction DR2. The first via 160 may extend from the first face 150a of the first mold layer 150 to the second face 150b of the first mold layer 150.

Hereinafter, a semiconductor package according to an embodiment of the present inventive concepts will be described referring to FIG. 4. Differences from the semiconductor package shown in FIG. 1 will be mainly described and a repeated description of similar elements will be omitted for convenience of explanation.

Figure 4:
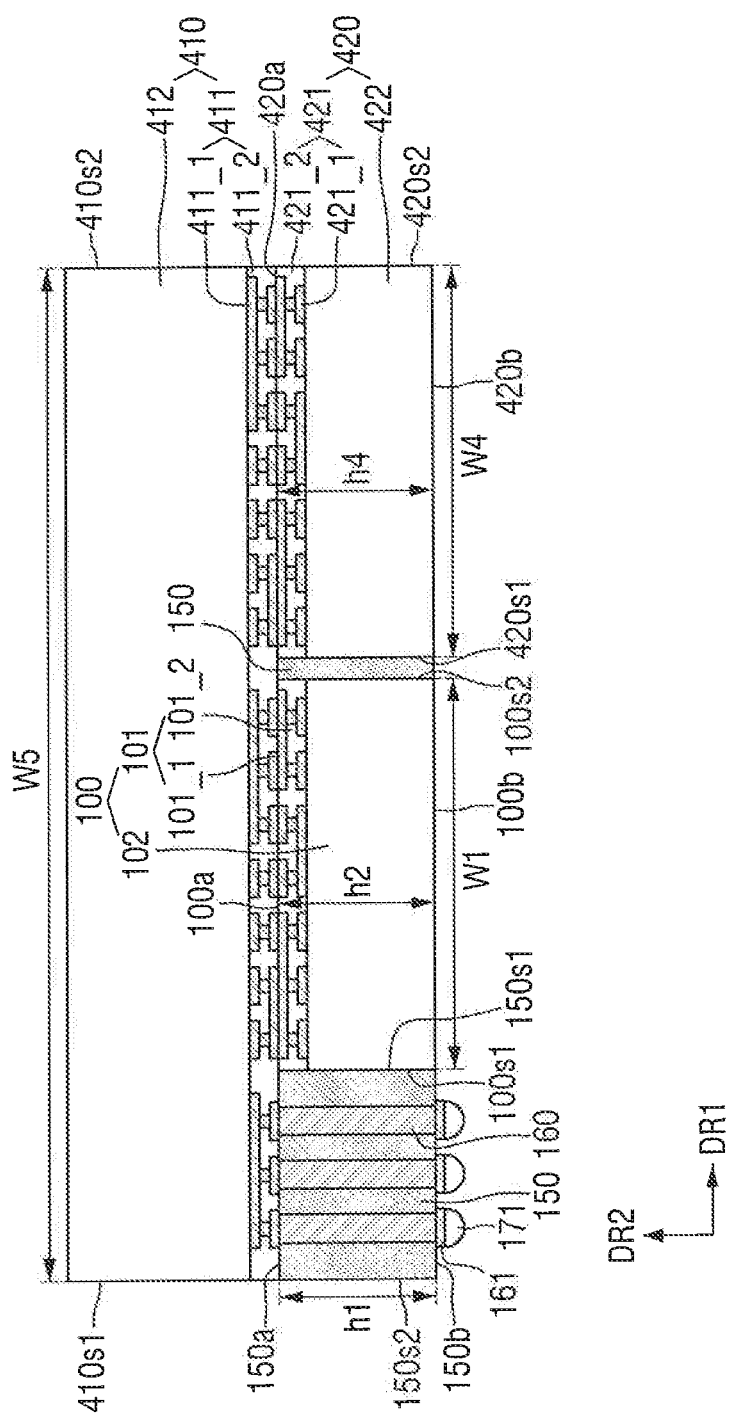
FIG. 4 is a cross-sectional view of a semiconductor package according to an embodiment of the present inventive concepts.

FIG. 4 is a cross-sectional view of a semiconductor package according to an embodiment of the present inventive concepts.

Referring to FIG. 4, in the semiconductor package according to an embodiment of the present inventive concepts, two semiconductor chips may be disposed on the lower face of a second semiconductor chip 410.

The second semiconductor chip 410 may be disposed on the first face 100a of the first semiconductor chip 100. The second semiconductor chip 410 may include a first side wall 410s1, and a second side wall 410s2 opposite to the first side wall 410s1 (e.g., in the horizontal direction DR1). The second semiconductor chip 410 may include a second wiring layer 411 and a second semiconductor layer 412. A lower surface of the second semiconductor layer 412 may directly contact an upper surface of the second wiring layer 411. In an embodiment, the second semiconductor layer 412 may include a transistor.

The second wiring layer 411 may be in direct contact with the first wiring layer 101. The second wiring layer 411 may include a plurality of second wirings 411_1, and a second insulating layer 411_2 surrounding the plurality of second wirings 411_1. A portion of the second wirings 411_1 may directly contact a portion of the plurality of first wirings 101_1 of the first wiring layer 101. The plurality of second wirings 411_1 may be electrically connected to the plurality of first wirings 101_1 without any additional elements therebetween.

The width W5 of the second wiring layer 411 in the horizontal direction DR1 may be substantially the same as the width W5 of the second semiconductor chip 410 in the horizontal direction DR1. For example, the second wiring layer 411 may completely overlap the second semiconductor chip 410, such as the second semiconductor layer 412, in the vertical direction DR2.

A width W5 of the second semiconductor chip 410 in the horizontal direction DR1 may be greater than the width W1 of the first semiconductor chip 100 in the horizontal direction DR1. For example, the width W5 of the second wiring layer 411 in the horizontal direction DR1 may be greater than the width W1 of the first wiring layer 101 in the horizontal direction DR1.

The third semiconductor chip 420 may be disposed on the lower face of the second semiconductor chip 410. The third semiconductor chip 420 may be spaced apart from the first semiconductor chip 100 in the horizontal direction DR1.

The third semiconductor chip 420 may include a first face 420a, and a second face 420b opposite to the first face 420a (e.g., in the vertical direction DR2). In the embodiment of FIG. 1, the first face 420a of the third semiconductor chip 420 is the upper face of the third semiconductor chip 420, and the second face 420b of the third semiconductor chip 420 is the lower face of the third semiconductor chip 420. Further, the third semiconductor chip 420 may include a first side wall 420s1, and a second side wall 420s2 opposite to the first side wall 420s1 (e.g., in the horizontal direction DR1).

The third semiconductor chip 420 may include a third wiring layer 421 and a third semiconductor layer 422. A lower surface of the third wiring layer 421 may directly contact an upper surface of the third semiconductor layer 422. For example, the upper face of the third wiring layer 421 may form and be defined as being the first face 420a of the third semiconductor chip 420. In an embodiment, the third semiconductor layer 422 may include a transistor.

The third wiring layer 421 may be in direct contact with the second wiring layer 411. The third wiring layer 421 may include a plurality of third wirings 421_1, and a third insulating layer 421_2 surrounding the plurality of third wirings 421_1. A portion of the plurality of third wirings 421_1 may directly contact a portion of the plurality of second wirings 411_1 and the plurality of third wirings 421_1 may be electrically connected to the plurality of second wirings 411_1 without any additional elements therebetween.

The width W4 of the third wiring layer 421 in the horizontal direction DR1 may be substantially the same as the width W4 of the third semiconductor chip 420 in the horizontal direction DR1. For example, the third wiring layer 421 may completely overlap the third semiconductor chip 420, such as the third semiconductor layer 422, in the vertical direction DR2. The width W4 of the third semiconductor chip 420 in the horizontal direction DR1 may be smaller than a width W5 of the second semiconductor chip 410 in the horizontal direction DR1.

The second side wall 420s2 of the third semiconductor chip 420 may be aligned with the second side wall 410s2 of the second semiconductor chip 410 in the vertical direction DR2.

The first mold layer 150 may be disposed on the first side wall 100s1 of the first semiconductor chip 100. The first mold layer 150 may also be disposed between the first semiconductor chip 100 and the third semiconductor chip 420 (e.g., in the horizontal direction DR1). For example, the first mold layer 150 may directly contact each of the first side wall 100s1 of the first semiconductor chip 100, the second side wall 100s2 of the first semiconductor chip 100, and the first side wall 420s1 of the third semiconductor chip 420. As shown in the embodiment of FIG. 4, the first face 150a, which is the upper face of the first mold layer 150, may directly contact a lower surface of the second wiring layer 411 of the second semiconductor chip 410. The second side wall 150s2 of the first mold layer 150 may be aligned with the first side wall 410s1 of the second semiconductor chip 410 in the vertical direction DR2.

The second face 150b, which is the lower face of the first mold layer 150, may be positioned on the same plane as each of the second face 100b of the first semiconductor chip 100 and the second face 420b of the third semiconductor chip 420. The height h1 of the first mold layer 150 in the vertical direction DR2 may be substantially the same as each of the height h2 of the first semiconductor chip 100 in the vertical direction DR2 and the height h4 of the third semiconductor chip 420 in the vertical direction DR2.

The first via 160 may be formed inside the first mold layer 150. The first via 160 may penetrate the first mold layer 150 in the vertical direction DR2. The first via 160 may extend from the first face 150a of the first mold layer 150 to the second face 150b of the first mold layer 150.

Hereinafter, the semiconductor package according to an embodiment of the present inventive concepts will be described referring to FIG. 5. Differences from the semiconductor package shown in FIG. 1 will be mainly described and a repeated description of similar elements will be omitted for convenience of explanation.

Figure 5:
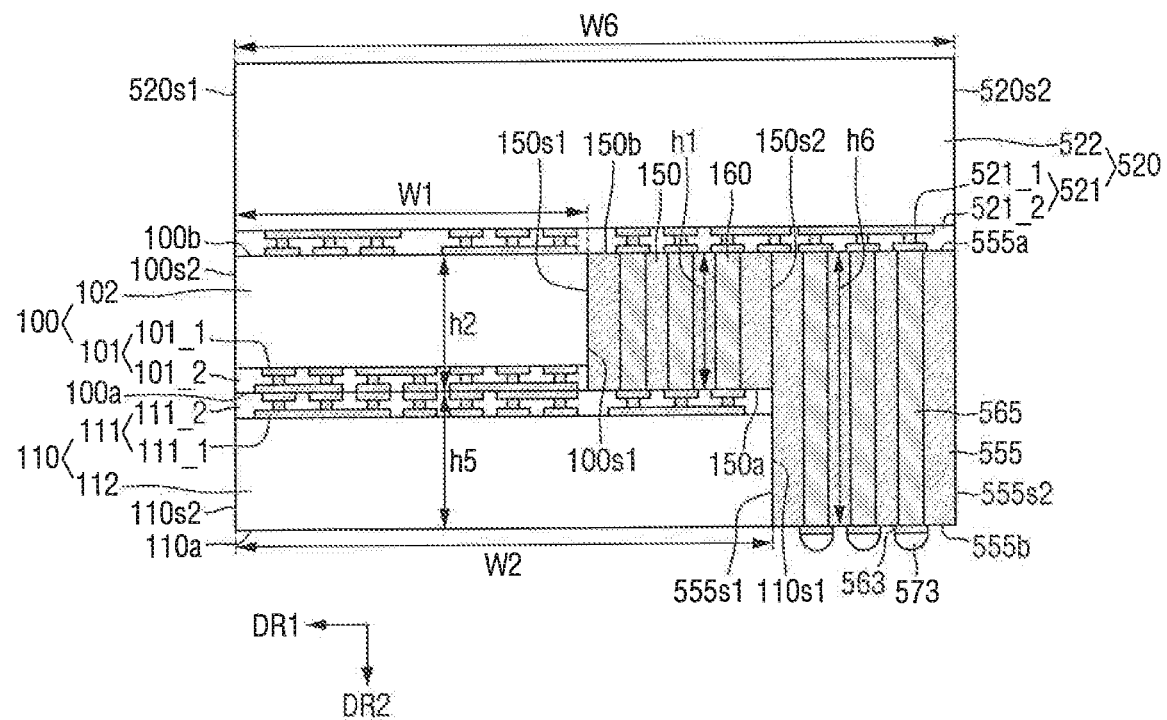
FIG. 5 is a cross-sectional view of a semiconductor package according to an embodiment of the present inventive concepts.

FIG. 5 is a cross-sectional view of a semiconductor package according to an embodiment of the present inventive concepts.

Referring to the embodiment of FIG. 5, the second semiconductor chip 110 may be disposed on the first face 100a of the first semiconductor chip 100, and the third semiconductor chip 520 may be disposed on the second face 100b of the first semiconductor chip 100.

The third semiconductor chip 520 may include a first side wall 520s1, and a second side wall 520s2 opposite to the first side wall 520s1 (e.g., in the horizontal direction DR1). The third semiconductor chip 520 may include a third wiring layer 521 and a third semiconductor layer 522. For example, as shown in the embodiment of FIG. 5, an upper surface of the third wiring layer 521 may directly contact a lower surface of the third semiconductor layer 522. In an embodiment, the third semiconductor layer 522 may include a transistor.

A lower surface of the third wiring layer 521 may directly contact each of the second face 100b of the first semiconductor chip 100 and the second face 150b of the first mold layer 150. The third wiring layer 521 may include a plurality of third wirings 521_1, and a third insulating layer 521_2 surrounding the plurality of third wirings 521_1.

A width W6 of the third wiring layer 521 in the horizontal direction DR1 may be substantially the same as the width W6 of the third semiconductor chip 520 in the horizontal direction DR1. For example, the third wiring layer 521 may completely overlap the third semiconductor chip 520, such as the third semiconductor layer 522, in the vertical direction DR2.

The width W6 of the third semiconductor chip 520 in the horizontal direction DR1 may be greater than the width W1 of the first semiconductor chip 100 in the horizontal direction DR1. For example, the width W6 of the third wiring layer 521 in the horizontal direction DR1 may be greater than the width W1 of the first wiring layer 101 in the horizontal direction DR1. The width W6 of the third semiconductor chip 520 in the horizontal direction DR1 may also be greater than the width W2 of the second semiconductor chip 110 in the horizontal direction DR1. For example, the width W6 of the third wiring layer 521 in the horizontal direction DR1 may be greater than the width W2 of the second wiring layer 111 of the second semiconductor chip 110 in the horizontal direction DR1.

The first side wall 520s1 of the third semiconductor chip 520 may be aligned with each of the second side wall 100s2 of the first semiconductor chip 100 and the second side wall 110s2 of the second semiconductor chip 110 in the vertical direction DR2.

The first mold layer 150 may be disposed between the second semiconductor chip 110 and the third semiconductor chip 520 on the first side wall 100s1 of the first semiconductor chip 100. The first mold layer 150 may directly contact each of the first side wall 100s1 of the first semiconductor chip 100, the upper face of the second semiconductor chip 110, such as an upper surface of the second wiring layer 111 of the second semiconductor chip 110, and the lower face of the third semiconductor chip 520, such as a lower surface of the third wiring layer 521. The second side wall 150s2 of the first mold layer 150 may be aligned with the first side wall 110s1 of the second semiconductor chip 110 in the vertical direction DR2.

The first via 160 may penetrate the first mold layer 150 in the vertical direction DR2. The first via 160 may extend from the first face 150a of the first mold layer 150 to the second face 150b of the first mold layer 150. The third semiconductor chip 520 may be electrically connected to the second semiconductor chip 110 through the first via 160.

The second mold layer 555 may be disposed on each of the first side wall 110s1 of the second semiconductor chip 110 and the second side wall 150s2 of the first mold layer 150. A first side wall 555s1 of the second mold layer 555 may directly contact each of the first side wall 110s1 of the second semiconductor chip 110 and the second side wall 150s2 of the first mold layer 150. A first face 555a, which is the upper face of the second mold layer 555, may be in direct contact with the third wiring layer 521 of the third semiconductor chip 520.

A second side wall 555s2 of the second mold layer 555 opposite to the first side wall 555s1 of the second mold layer 555 (e.g., in the horizontal direction DR1) may be aligned with the second side wall 520s2 of the third semiconductor chip 520 in the vertical direction DR2. A second face 555b, which is the lower face of the second mold layer 555, may be positioned on the same plane as the first face 110a which is the lower face of the second semiconductor chip 110.

A height h6 of the second mold layer 555 in the vertical direction DR2 may be substantially the same as the sum of the height h2 of the first semiconductor chip 100 in the vertical direction DR2 and the height h5 of the second semiconductor chip 110 in the vertical direction DR2. Further, the height h6 of the second mold layer 555 in the vertical direction DR2 may be substantially the same as the sum of the height h1 of the first mold layer 150 in the vertical direction DR2 and the height h5 of the second semiconductor chip 110 in the vertical direction DR2.

In an embodiment, the second mold layer 555 may include an epoxy molding compound (EMC) or two or more kinds of silicone hybrid materials. However, embodiments of the present inventive concepts are not limited thereto.

A second via 565 may penetrate the second mold layer 555 in the vertical direction DR2. The second via 565 may extend from the first face 555a of the second mold layer 555 to the second face 555b of the second mold layer 555. For example, the second via 565 may be exposed to each of the first face 555a of the second mold layer 555 and the second face 555b of the second mold layer 555.

The height h6 of the second via 565 in the vertical direction DR2 may be substantially the same as the sum of the height h2 of the first semiconductor chip 100 in the vertical direction DR2 and the height h5 of the second semiconductor chip 110 in the vertical direction DR2. Further, the height h6 of the second via 565 in the vertical direction DR2 may be substantially the same as the sum of the height h1 of the first mold layer 150 in the vertical direction DR2 and the height h5 of the second semiconductor chip 110 in the vertical direction DR2.

The second via 565 may include a conductive material. Although the embodiment of FIG. 5 shows that the second via 565 is formed of a single film, embodiments of the present inventive concepts are not limited thereto. For example, in some embodiments, the second via 565 may be formed of multi-films.

A third conductive pad 563 may be disposed on the second face 555b of the second mold layer 555. The third conductive pad 563 may overlap the second via 565 in the vertical direction DR2. The third conductive pad 563 may be electrically connected to the second via 565. The third conductive pad 563 may include a conductive material.

A third solder ball 573 may be disposed on the second face 555b of the second mold layer 555. The third solder ball 573 may directly contact with the third conductive pad 563. In an embodiment, the third solder ball 573 may protrude convexly from the third conductive pad 563. However, embodiments of the present inventive concepts are not limited thereto. The third solder ball 573 may be a portion by which the semiconductor package is electrically connected to another external element.

In an embodiment, the third solder ball 573 may include at least one compound selected from tin (Sn), indium (In), lead (Pb), zinc (Zn), nickel (Ni), gold (Au), silver (Ag), copper (Cu), antimony (Sb), bismuth (Bi), and combinations thereof. However, embodiments of the present inventive concepts are not limited thereto.

Hereinafter, the semiconductor package according to an embodiment of the present inventive concepts will be described referring to FIG. 6. Differences from the semiconductor package shown in FIG. 5 will be mainly described and a repeated description of similar elements will be omitted for convenience of explanation.

Figure 6:
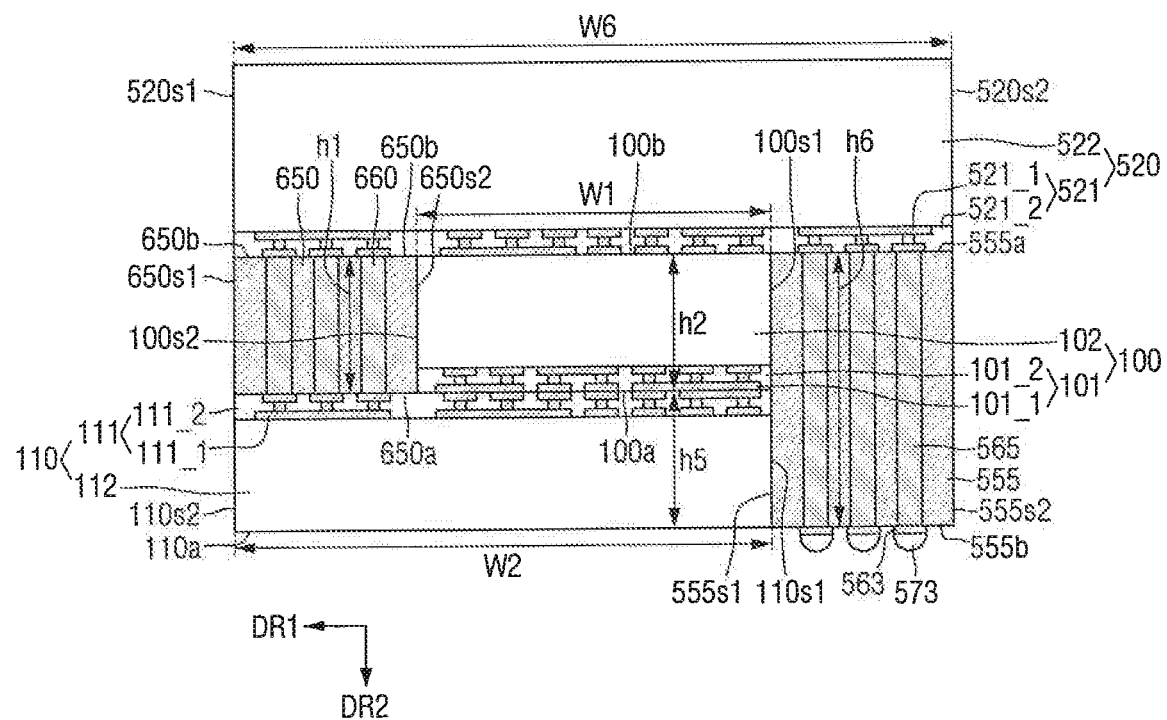
FIG. 6 is a cross-sectional view of a semiconductor package according to an embodiment of the present inventive concepts.

FIG. 6 is a cross-sectional view of a semiconductor package according to an embodiment of the present inventive concepts.

Referring to the embodiment of FIG. 6, the first semiconductor chip 100 may be disposed between the first mold layer 650 and the second mold layer 555 (e.g., in the horizontal direction DR1).

A second side wall 650s2 of the first mold layer 650 may directly contact the second side wall 100s2 of the first semiconductor chip 100. As shown in the embodiment of FIG. 6, the second face 650b, which is the upper face of the first mold layer 650, may directly contact the third wiring layer 521 of the third semiconductor chip 520. The first face 650a, which is the lower face of the first mold layer 650, may directly contact the upper face of the second semiconductor chip 110.

A first side wall 650s1 of the first mold layer 650 may be aligned with each of the second side wall 110s2 of the second semiconductor chip 110 and the first side wall 520s1 of the third semiconductor chip 520 in the vertical direction DR2.

The first via 660 may penetrate the first mold layer 650 in the vertical direction DR2. The first via 660 may extend from the first face 650a of the first mold layer 650 to the second face 650b of the first mold layer 650. The third semiconductor chip 520 may be electrically connected to the second semiconductor chip 110 through the first via 660.

The second mold layer 555 may be disposed on each of the first side wall 100s1 of the first semiconductor chip 100 and the first side wall 110s1 of the second semiconductor chip 110. For example, the first side wall 555s1 of the second mold layer 555 may directly contact each of the first side wall 100s1 of the first semiconductor chip 100 and the first side wall 110s1 of the second semiconductor chip 110.

The second side wall 555s2 of the second mold layer 555 opposite to the first side wall 555s1 of the second mold layer 555 (e.g., in the horizontal direction DR1) may be aligned with the second side wall 520s2 of the third semiconductor chip 520 in the vertical direction DR2. As shown in the embodiment of FIG. 6, the second face 555b, which is the lower face of the second mold layer 555, may be positioned on the same plane as the first face 110a which is the lower face of the second semiconductor chip 110.

Hereinafter, a semiconductor package according to an embodiment of the present inventive concepts will be described referring to FIG. 7. Differences from the semiconductor package shown in FIG. 1 will be mainly described and a repeated description of similar elements will be omitted for convenience of explanation.

Figure 7:
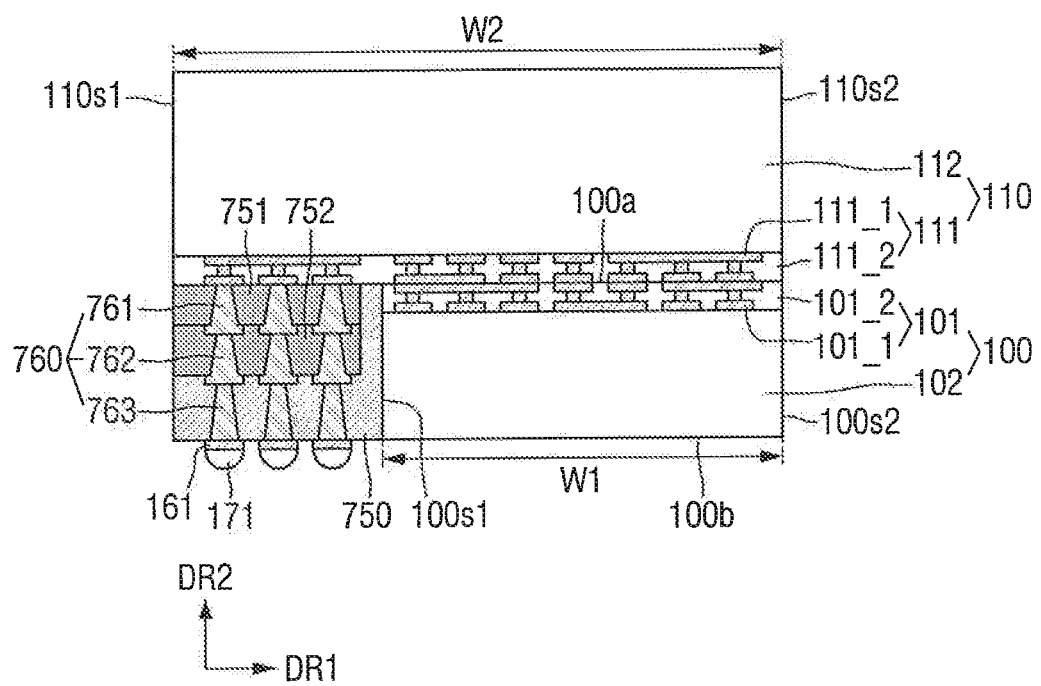
FIG. 7 is a cross-sectional view of a semiconductor package according to an embodiment of the present inventive concepts.

FIG. 7 is a cross-sectional view of a semiconductor package according to an embodiment of the present inventive concepts.

Referring to the embodiment of FIG. 7, a first via 760 may include first to third sub vias 761, 762 and 763.

A third mold layer 751 may disposed adjacent to the first side wall 100s1 of the first semiconductor chip 100. A portion of the first mold layer 750 may be disposed between the third mold layer 751 and the first side wall 100s1 of the first semiconductor chip 100. An upper surface of the third mold layer 751 may directly contact a lower surface of the second wiring layer 111 of the second semiconductor chip 110. A fourth mold layer 752 may disposed adjacent to the first side wall 100s1 of the first semiconductor chip 100 and a portion of the first mold layer 750 may be disposed between the fourth mold layer 752 and the first side wall 100s1 of the first semiconductor chip. An upper face of the fourth mold layer 752 may directly contact the lower face of the third mold layer 751. The first mold layer 750 may cover the side wall of the third mold layer 751 and the side wall and the lower face of the fourth mold layer 752 and may directly contact the first side wall 100s1 of the first semiconductor chip 100.

Although in the embodiment of FIG. 7 each of one side wall of the third mold layer 751 and one side wall of the fourth mold layer 752 (e.g., outer sidewalls of the third and fourth mold layers 751, 752) is aligned with the first side wall 110s1 of the second semiconductor chip 110 in the vertical direction DR2, embodiments of the present inventive concepts are not limited thereto.

As shown in the embodiment of FIG. 7, a first sub via 761 may penetrate the third mold layer 751 in the vertical direction DR2. The first sub via 761 may directly contact a lower surface of the second wiring layer 111 of the second semiconductor chip 110. A second sub via 762 may penetrate the fourth mold layer 752 in the vertical direction DR2. An upper surface of the second sub via 762 may directly contact a lower surface of the first sub via 761. A third sub via 763 may penetrate the first mold layer 750 in the vertical direction DR2. An upper surface of the third sub via 763 may directly contact a lower surface of the second sub via 762. Each of the first to third sub vias 761, 762 and 763 may include a conductive material. The first conductive pad 161 may be electrically connected to the third sub via 763.

Hereinafter, a semiconductor package according to an embodiment of the present inventive concepts will be described referring to FIG. 8. Differences from the semiconductor package shown in FIG. 1 will be mainly described and a repeated description of similar elements will be omitted for convenience of explanation.

Figure 8:
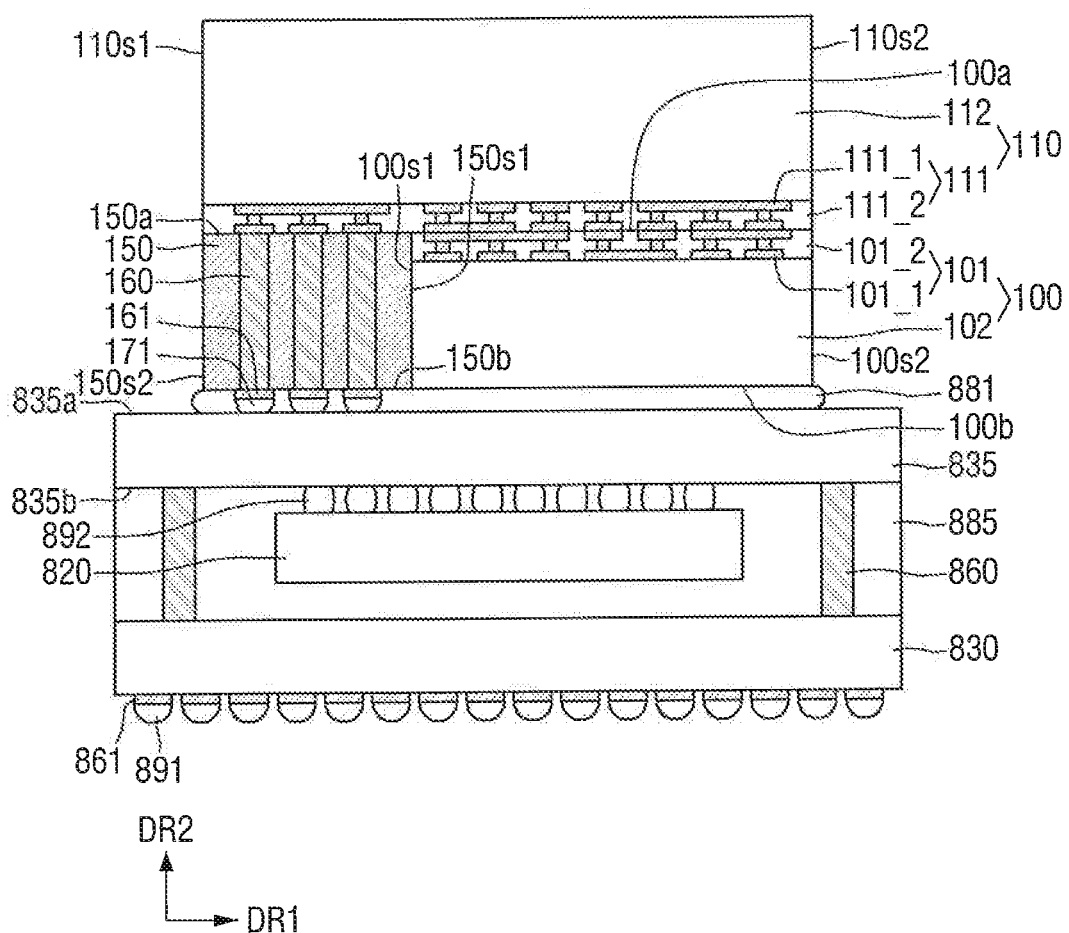
FIG. 8 is a cross-sectional view of a semiconductor package according to an embodiment of the present inventive concepts.

FIG. 8 is a cross-sectional view of a semiconductor package according to an embodiment of the present inventive concepts.

Referring to the embodiment of FIG. 8, the semiconductor package may include a substrate 830, an interposer 835, a third semiconductor chip 820, a fifth mold layer 885, a first underfill material 881, a third via 860, a fourth conductive pad 861, a fourth solder ball 891 and a fifth solder ball 892.

The interposer 835 may be disposed on the second face 100b of the first semiconductor chip 100. The interposer 835 may include a first face 835a facing the second face 100b of the first semiconductor chip 100, and a second face 835b opposite to the first face 835a (e.g., in the vertical direction DR2).

The semiconductor package including the first semiconductor chip 100, the second semiconductor chip 110, the first mold layer 150, and the first via 160 may be attached to the first face 835a of the interposer 835 through the first solder ball 171. The first underfill material 881 may be disposed between the first face 835a of the interposer 835 and the second face 100b of the first semiconductor chip 100 (e.g., in the vertical direction DR2), and between the first face 835a of the interposer 835 and the second face 150b of the first mold layer 150 (e.g., in the vertical direction DR2). The first underfill material 881 may surround the lateral side surfaces of the first solder ball 171 and the first conductive pad 161.

The substrate 830 may be disposed on the second face 835b of the interposer 835. In an embodiment, the substrate 830 may be a printed circuit board (PCB) or a ceramic substrate. However, embodiments of the present inventive concepts are not limited thereto.

The fourth conductive pad 861 may be disposed on the lower face of the substrate 830. The fourth solder ball 891 may be disposed on the lower face of the substrate 830 and an upper surface of the fourth solder ball 891 may directly contact a lower surface of the fourth conductive pad 861. In an embodiment, the fourth solder ball 891 may protrude convexly from the fourth conductive pad 861. The fourth solder ball 891 may be a portion by which the semiconductor package is electrically connected to another external element.

The third semiconductor chip 820 may be disposed between the substrate 830 and the second face 835b of the interposer 835. The third semiconductor chip 820 may be attached to the second face 835b of the interposer 835 through the fifth solder ball 892. The third semiconductor chip 820 may be directly electrically connected to the interposer 835. In the embodiment of FIG. 8, a single third semiconductor chip 820 is disposed between the substrate 830 and the interposer 835. However, embodiments of the present inventive concepts are not limited thereto. For example, in some embodiments, a plurality of third semiconductor chips 820 may be disposed between the substrate 830 and the interposer 835. In this embodiment, each of the plurality of third semiconductor chips 820 may be directly electrically connected to the interposer 835.

The third via 860 may be disposed between the substrate 830 and the second face 835b of the interposer 835. The substrate 830 may be directly electrically connected to the interposer 835 through the third via 860.

The fifth mold layer 885 may be disposed between the substrate 830 and the second face 835b of the interposer 835 (e.g., in the vertical direction DR2). The fifth mold layer 885 may surround lateral side surfaces of the fifth solder ball 892, the third semiconductor chip 820 and lateral side surfaces of the third via 860.

Hereinafter, the semiconductor package according to an embodiment of the present inventive concepts will be described referring to FIG. 9. Differences from the semiconductor package shown in FIG. 1 will be mainly described and a repeated description of similar elements will be omitted for convenience of explanation.

Figure 9:
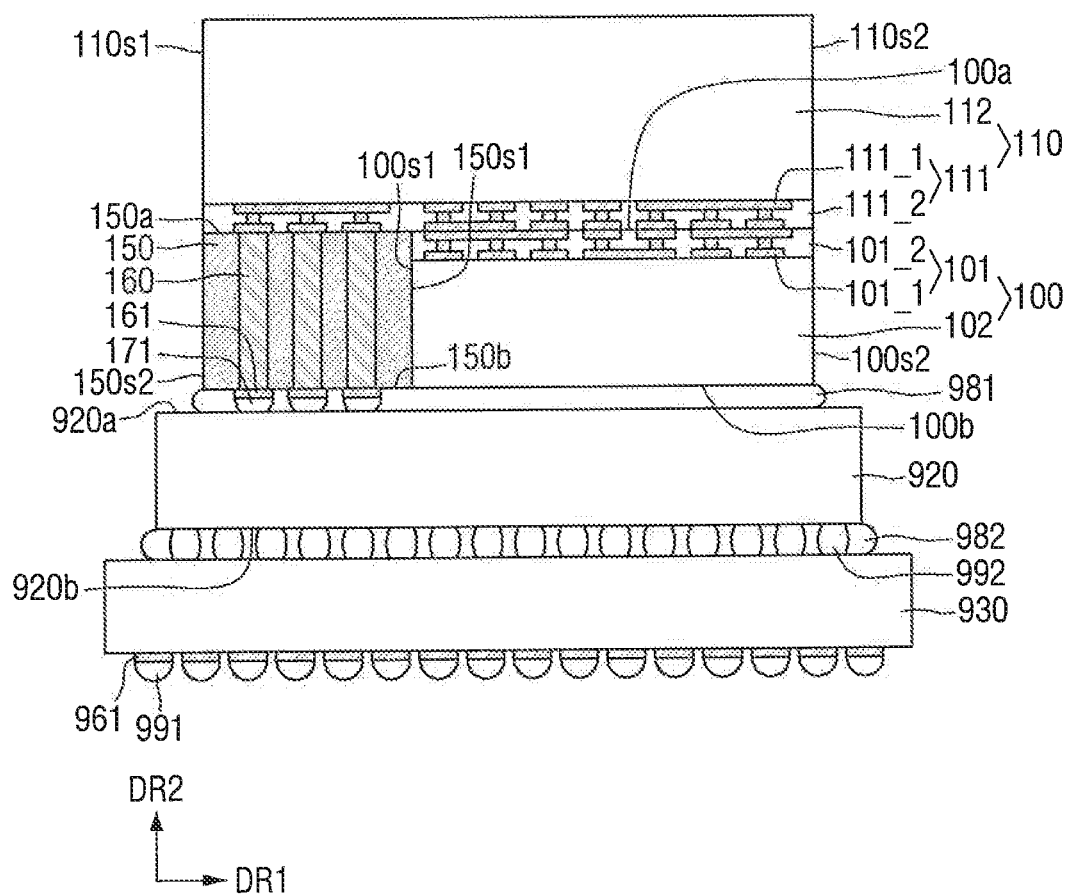
FIG. 9 is a cross-sectional view of a semiconductor package according to an embodiment of the present inventive concepts.

FIG. 9 is a cross-sectional view of a semiconductor package according to an embodiment of the present inventive concepts.

Referring to the embodiment of FIG. 9, the semiconductor package may include a substrate 930, a third semiconductor chip 920, a first underfill material 981, a second underfill material 982, a fourth conductive pad 961, a fourth solder ball 991 and a fifth solder ball 992.

The third semiconductor chip 920 may be disposed on the second face 100b of the first semiconductor chip 100. The third semiconductor chip 920 may include a first face 920a facing the second face 100b of the first semiconductor chip 100, and a second face 920b opposite to the first face 920a (e.g., in the vertical direction DR2).

The semiconductor package including the first semiconductor chip 100, the second semiconductor chip 110, the first mold layer 150, and the first via 160 may be attached to the first face 920a of the third semiconductor chip 920 through the first solder ball 171. The first underfill material 981 may be disposed between the first face 920a of the third semiconductor chip 920 and the second face 100b of the first semiconductor chip 100 (e.g., in the vertical direction DR2), and between the first face 920a of the third semiconductor chip 920 and the second face 150b of the first mold layer 150. The first underfill material 981 may surround the lateral side surfaces of the first solder ball 171.

The substrate 930 may be disposed on the second face 920b of the third semiconductor chip 920. In the embodiment of FIG. 9, a single substrate 930 is disposed on the second face 920b of the third semiconductor chip 920. However, embodiments of the present inventive concepts are not limited thereto. For example, in some embodiments, a plurality of substrates 930 may be disposed on the second face 920b of the third semiconductor chip 920. In this embodiment, the third semiconductor chip 920 may be electrically connected to at least one of the plurality of substrates 930. In an embodiment, the substrate 930 may be a printed circuit board (PCB) or a ceramic substrate. However, embodiments of the present inventive concepts are not limited thereto.

The third semiconductor chip 920 may be attached to the upper face of the substrate 930 through the fifth solder ball 992. The third semiconductor chip 920 may be directly electrically connected to the substrate 930 through the fifth solder ball 992. The second underfill material 982 may be disposed between the second face 920b of the third semiconductor chip 920 and the upper face of the substrate 930 (e.g., in the vertical direction DR2). The second underfill material 982 may surround lateral side surfaces of the fifth solder ball 992.

The fourth conductive pad 961 may be disposed on the lower face of the substrate 930. The fourth solder ball 991 may be disposed on the lower face of the substrate 930 and an upper surface of the fourth solder ball 991 may directly contact a lower surface of the fourth conductive pad 961. In an embodiment, the fourth solder ball 991 may protrude convexly from the fourth conductive pad 961. The fourth solder ball 991 may be a portion by which the semiconductor package is electrically connected to another external element.

Hereinafter, a method for fabricating the semiconductor package shown in FIG. 1 will be described referring to FIGS. 10 to 12 according to embodiments of the present inventive concepts.

Figure 10:
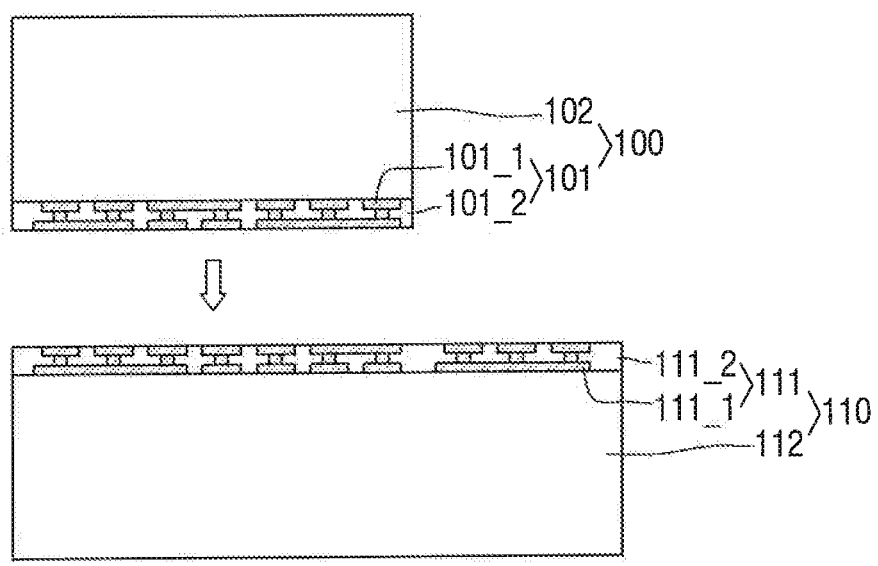
FIGS. 10 to 12 are intermediate stage diagrams of a method for fabricating the semiconductor package shown in FIG. 1 according to embodiments of the present inventive concepts.
Figure 10:
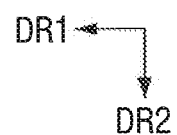
Figure 11:
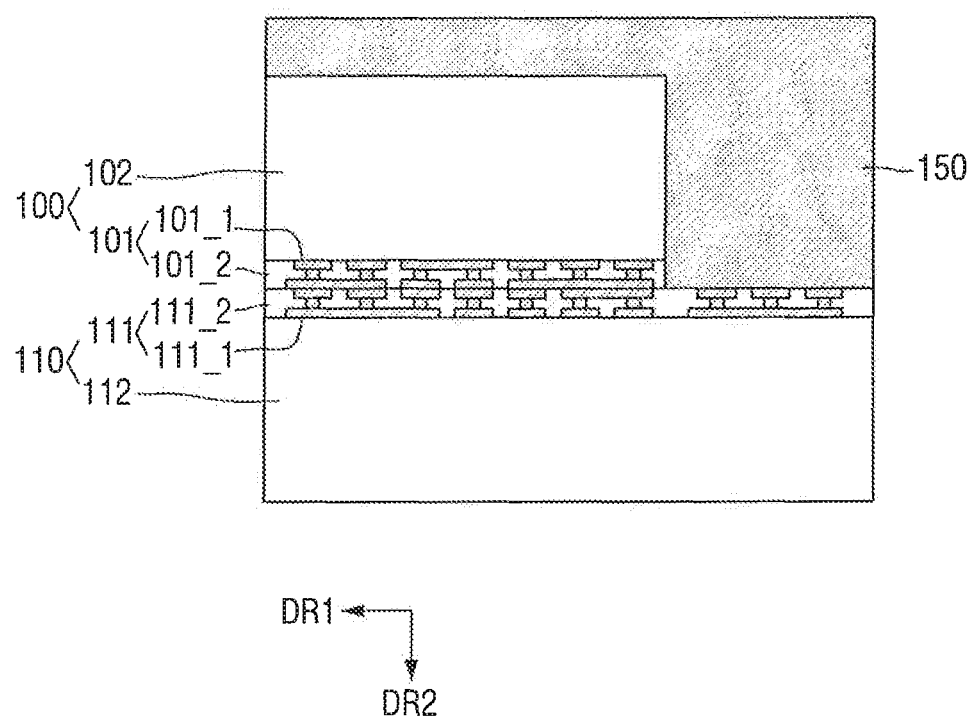
Figure 12:
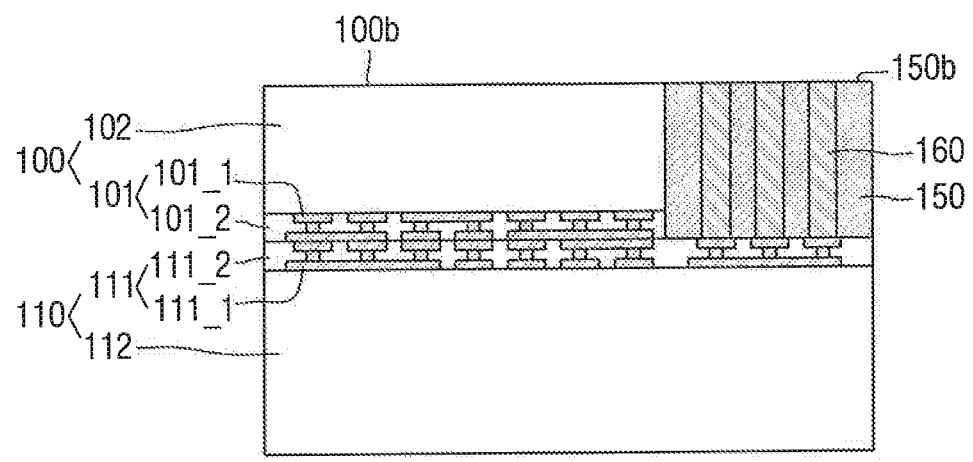
Figure 12:
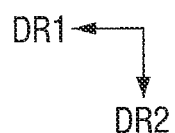

FIGS. 10 to 12 are intermediate stage diagrams for explaining the method for fabricating the semiconductor package shown in FIG. 1 according to embodiments of the present inventive concepts.

Referring to the embodiment of FIG. 10, the first semiconductor chip 100 may be attached on the second semiconductor chip 110. The first wiring layer 101 of the first semiconductor chip 100 may be attached to the second wiring layer 111 of the second semiconductor chip 110 (e.g., attached directly in the vertical direction DR2). At least a partial portion of the plurality of first wirings 101_1 disposed inside the first wiring layer 101 may be in direct contact with at least a partial portion of a plurality of second wirings 111_1 disposed inside the second wiring layer 111.

In an embodiment, the second semiconductor chip 110 may be a wafer. However, embodiments of the present inventive concepts are not limited thereto.

Referring to the embodiment of FIG. 11, the first mold layer 150 may be formed on the second semiconductor chip 110. The first mold layer 150 may be formed to cover an upper surface and a lateral side wall of the first semiconductor chip 100 and an exposed upper surface of the second semiconductor chip 110 positioned adjacent to the side wall of the first semiconductor chip 100.

Referring to the embodiment of FIG. 12, a first via 160 that penetrates the first mold layer 150 formed on the side wall of the first semiconductor chip 100 in the vertical direction DR2 may be formed. For example, the embodiment of FIG. 12 shows three first vias 160 that are formed to penetrate the first mold layer 150. The three first vias 160 are spaced apart in the horizontal direction DR1. However, embodiments of the present inventive concepts are not limited thereto and the number of first vias 160 may vary.

Subsequently, a partial portion of the first mold layer 150, a partial portion of the first semiconductor chip 100, and a partial portion of the first via 160 may be removed through a flattening process (e.g., a CMP process, etc.).

Referring to the embodiment of FIG. 1, a first conductive pad 161 in direct contact with the first via 160 may be formed on the second face 150b of the first mold layer 150. Subsequently, the first solder ball 171 may be formed on the first conductive pad 161.

Hereinafter, a method for fabricating the semiconductor package shown in FIG. 5 will be described referring to FIGS. 13 to 15 according to embodiments of the present inventive concepts.

Figure 13:
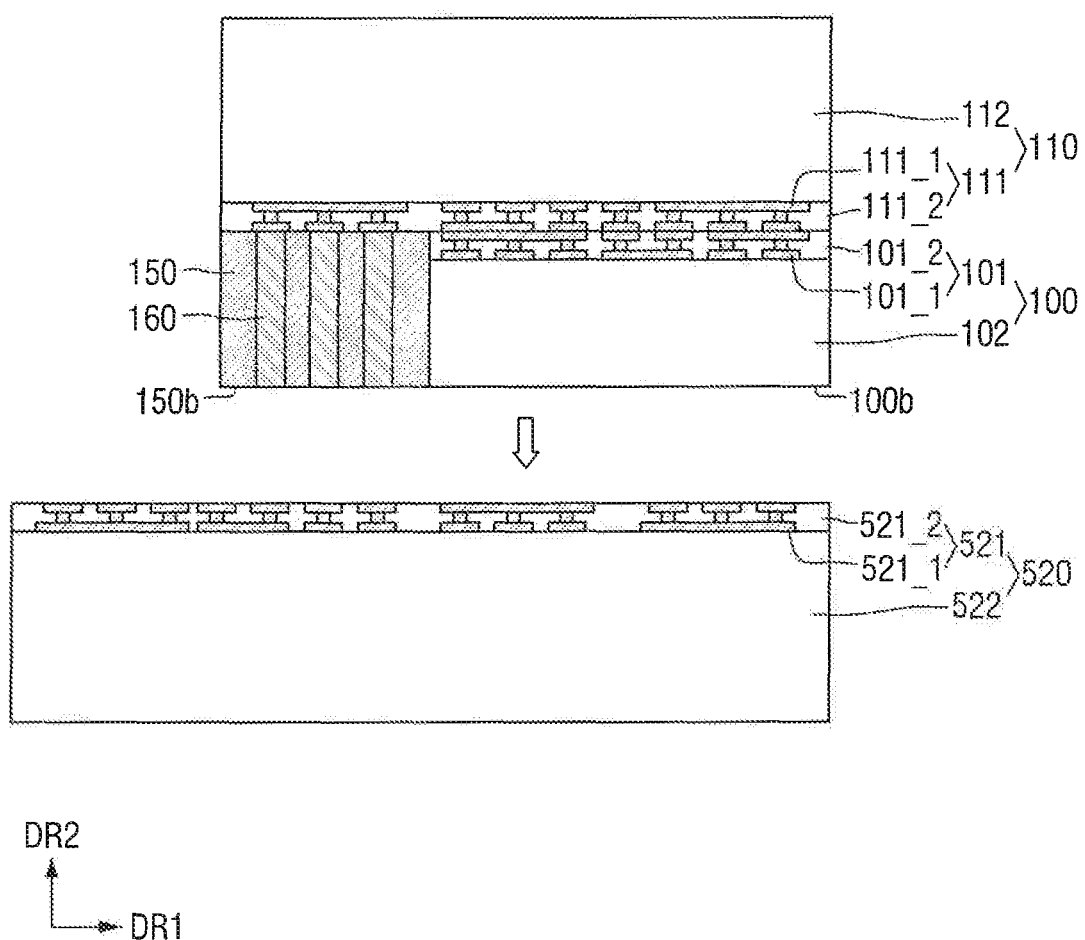
FIGS. 13 to 15 are intermediate stage diagrams for explaining the method for fabricating the semiconductor package shown in FIG. 5 according to embodiments of the present inventive concepts.
Figure 14:
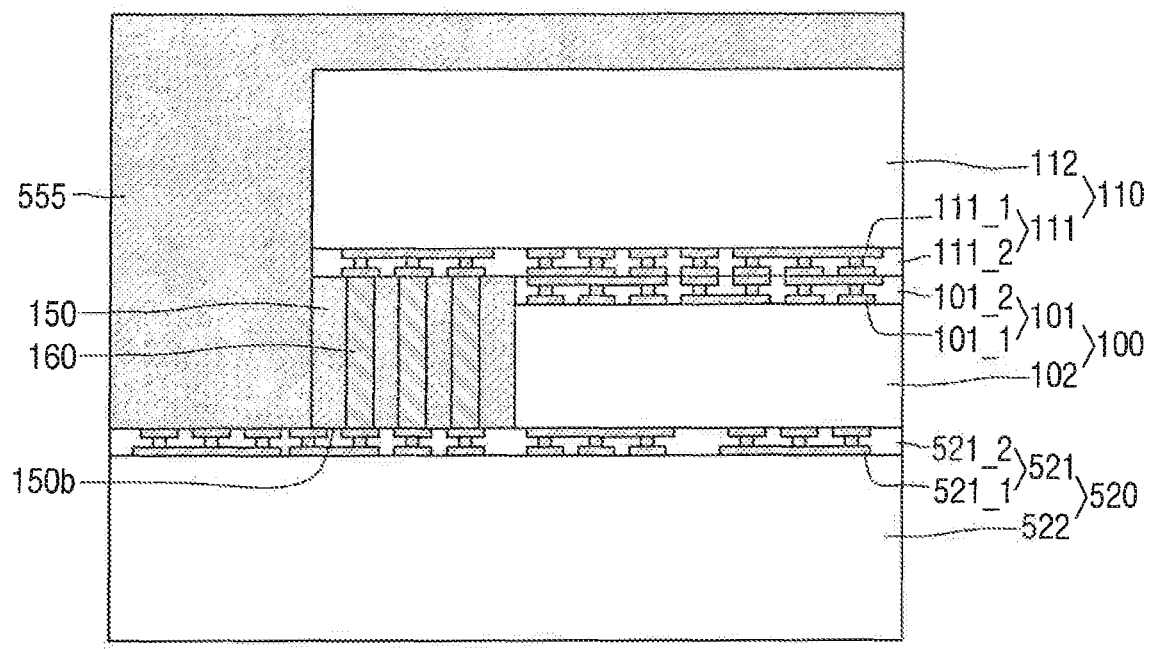
Figure 15:
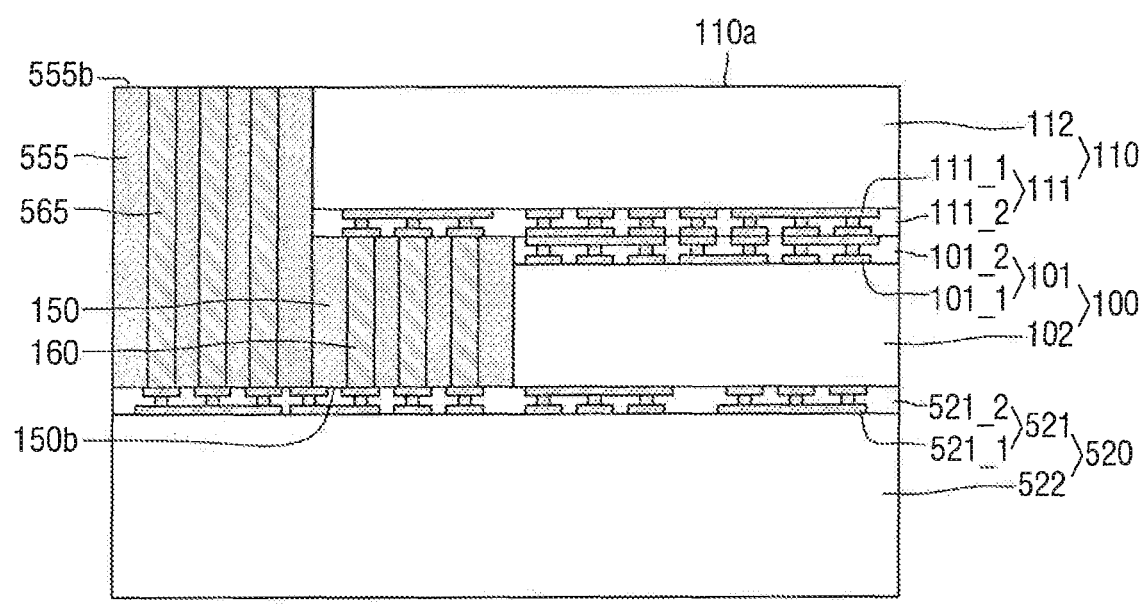

FIGS. 13 to 15 are intermediate stage diagrams for explaining the method for fabricating the semiconductor package shown in FIG. 5.

Referring to the embodiment of FIG. 13, after the fabricating process shown in the embodiments of FIGS. 10 to 12 is performed, the semiconductor package including the first semiconductor chip 100, the second semiconductor chip 110, the first mold layer 150 and the first via 160 may be attached on the third semiconductor chip 520. The second face 150b of the first mold layer 150 and the second face 100b of the first semiconductor chip 100 may be attached to the third wiring layer 521 of the third semiconductor chip 520. The first via 160 may be disposed in direct contact with at least a partial portion of the plurality of third wirings 521_1 disposed inside the third wiring layer 521.

In an embodiment, the third semiconductor chip 520 may be a wafer. However, embodiments of the present inventive concepts are not limited thereto.

Referring to the embodiment of FIG. 14, the second mold layer 555 may be formed on the third semiconductor chip 520. The second mold layer 555 may be formed to cover the second semiconductor chip 110 and the third semiconductor chip 520 exposed on the side wall of the first mold layer 150.

Referring to the embodiment of FIG. 15, a second via 565 which penetrates the second mold layer 555 formed on the side wall of the second semiconductor chip 110 in the vertical direction DR2 may be formed.

Subsequently, a partial portion of the second mold layer 555, a partial portion of the second semiconductor chip 110, and a partial portion of the second via 565 may be removed through a flattening process (e.g., a CMP process, etc.).

Referring to the embodiment of FIG. 5, a third conductive pad 563 which directly contacts the second via 565 may be formed on the second face 555b of the second mold layer 555. Subsequently, a third solder ball 573 may be formed on the third conductive pad 563.

Although embodiments of the present inventive concepts have been described above referring to the attached drawings, the present inventive concepts are not limited to the above examples and may be fabricated in various different forms. Those who have ordinary knowledge in the technical field to which the present inventive concepts belong will understand that the present inventive concepts may be carried out in other forms without changing the technical idea or essential features of the present inventive concepts. Therefore, it should be understood that the embodiments described above are not limitative.

What is claimed is:

1. A semiconductor package comprising:
a first semiconductor chip having a first face and a second face opposite to the first face in a vertical direction, the first semiconductor chip includes a first wiring layer having a surface that forms the first face;
a second semiconductor chip that is disposed on the first face of the first semiconductor chip, the second semiconductor chip including a second wiring layer in direct contact with the first wiring layer;
a first mold layer disposed on one lateral side of the first semiconductor chip, the first mold layer directly contacts the second wiring layer; and
a first via that penetrates the first mold layer in the vertical direction,
wherein a width of the first wiring layer in a horizontal direction is substantially same as a width of the first semiconductor chip in the horizontal direction,
a width of the second wiring layer in the horizontal direction is substantially same as a width of the second semiconductor chip in the horizontal direction, and
a height of the first via in the vertical direction is substantially same as a height of the first semiconductor chip in the vertical direction.

2. The semiconductor package of claim 1, wherein:
the first mold layer includes a first face and a second face opposite to the first face in the vertical direction;
the first face of the first mold layer directly contacts the second wiring layer; and the second face of the first mold layer is positioned on a same plane as the second face of the first semiconductor chip.

3. The semiconductor package of claim 1, wherein a height of the first mold layer in the vertical direction is substantially same as the height of the first semiconductor chip in the vertical direction.

4. The semiconductor package of claim 1, wherein:
a first side wall of the first semiconductor chip directly contacts the first mold layer; and
a second side wall of the first semiconductor chip that is opposite to the first side wall of the first semiconductor chip in the horizontal direction is aligned with a side wall of the second semiconductor chip.

5. The semiconductor package of claim 1, further comprising:
a substrate that is disposed on the second face of the first semiconductor chip, the substrate directly contacts each of the first via and the first mold layer.

6. The semiconductor package of claim 1, further comprising:
a third semiconductor chip that directly contacts the second wiring layer of the second semiconductor chip and is spaced apart from the first semiconductor chip in the horizontal direction.

7. The semiconductor package of claim 6, wherein the first mold layer and the first via are disposed between the first semiconductor chip and the third semiconductor chip.

8. The semiconductor package of claim 6, wherein:
the first mold layer and the first via are disposed on a first side wall of the first semiconductor chip; and
the third semiconductor chip is disposed on a side wall of the first mold layer that is opposite to the first side wall of the first semiconductor chip in the horizontal direction.

9. The semiconductor package of claim 1, further comprising:
a third semiconductor chip that is disposed on the second face of the first semiconductor chip and directly contacts each of the first via and the first mold layer, the third semiconductor chip including a third wiring layer;
a second mold layer disposed on one lateral side of the second semiconductor chip, the second mold layer directly contacts the third wiring layer; and
a second via that penetrates the second mold layer in the vertical direction.

10. The semiconductor package of claim 9, wherein:
a width of the third wiring layer in the horizontal direction is substantially same as a width of the third semiconductor chip in the horizontal direction; and
a height of the second via in the vertical direction is substantially same as a sum of the height of the first semiconductor chip in the vertical direction and a height of the second semiconductor chip in the vertical direction.

11. The semiconductor package of claim 1, further comprising:
an interposer disposed on the second face of the first semiconductor chip, the interposer including a first face facing the second face of the first semiconductor chip, and a second face opposite to the first face in the vertical direction;
a substrate disposed on the second face of the interposer, the substrate is directly electrically connected to the interposer; and a third semiconductor chip disposed between the substrate and the interposer, the third semiconductor chip is directly electrically connected to the interposer.

12. The semiconductor package of claim 1, further comprising:
a third semiconductor chip disposed on the second face of the first semiconductor chip, the third semiconductor chip having a first face facing the second face of the first semiconductor chip and a second face opposite to the first face in the vertical direction; and
a substrate disposed on the second face of the third semiconductor chip, the substrate is directly electrically connected to the third semiconductor chip.

13. A semiconductor package comprising:
a first semiconductor chip having a first face and a second face opposite to the first face in a vertical direction, the first semiconductor chip includes a first wiring layer having a surface that forms the first face;
a second semiconductor chip is disposed on the first face of the first semiconductor chip, the second semiconductor chip including a second wiring layer in direct contact with the first wiring layer;
a first mold layer disposed on one lateral side of the first semiconductor chip, the first mold layer having a first face in direct contact with the second wiring layer and a second face opposite to the first face in the vertical direction; and
a first via that penetrates the first mold layer in the vertical direction,
wherein a width of the first wiring layer in a horizontal direction is substantially same as a width of the first semiconductor chip in the horizontal direction,
a width of the second wiring layer in the horizontal direction is substantially same as a width of the second semiconductor chip in the horizontal direction,
a height of the first mold layer in the vertical direction is substantially same as a height of the first semiconductor chip in the vertical direction, and
the second face of the first mold layer is positioned on a same plane as the second face of the first semiconductor chip.

14. The semiconductor package of claim 13, wherein a height of the first via in the vertical direction is substantially same as the height of the first semiconductor chip in the vertical direction.

15. The semiconductor package of claim 13, wherein:
a first side wall of the first mold layer directly contacts a first side wall of the first semiconductor chip; and
a second side wall of the first mold layer that is opposite to the first side wall of the first mold layer in the horizontal direction is aligned with a side wall of the second semiconductor chip.

16. The semiconductor package of claim 13, further comprising:
a third semiconductor chip that directly contacts the second wiring layer of the second semiconductor chip and is spaced apart from the first semiconductor chip in the horizontal direction.

17. The semiconductor package of claim 13, further comprising:
a third semiconductor chip disposed on the second face of the first semiconductor chip, the third semiconductor chip including a third wiring layer that directly contacts each of the first via and the first mold layer;
a second mold layer disposed on one lateral side of the second semiconductor chip the second mold layer directly contacts the third wiring layer; and a second via that penetrates the second mold layer in the vertical direction.

18. The semiconductor package of claim 17, wherein the second mold layer directly contacts the first mold layer.

19. The semiconductor package of claim 17, wherein the first semiconductor chip is disposed between the first mold layer and the second mold layer.

20. A semiconductor package comprising:
a first semiconductor chip having a first face and a second face opposite to the first face, the first semiconductor chip including a first wiring layer having a surface that forms the first face;
a second semiconductor chip disposed on the first face of the first semiconductor chip, the second semiconductor chip including a second wiring layer that directly contacts the first wiring layer;
a mold layer disposed on one lateral side of the first semiconductor chip, the mold layer having a first face that directly contacts the second wiring layer, and a second face opposite to the first face;
a via that penetrates the mold layer in a vertical direction; and
a solder ball disposed on the second face of the mold layer and electrically connected to the via,
wherein a width of the first wiring layer in a horizontal direction is substantially same as a width of the first semiconductor chip in the horizontal direction,
a width of the second wiring layer in the horizontal direction is substantially same as a width of the second semiconductor chip in the horizontal direction,
a height of the via in the vertical direction is substantially same as a height of the first semiconductor chip in the vertical direction,
a height of the mold layer in the vertical direction is substantially same as the height of the first semiconductor chip in the vertical direction,
the second face of the mold layer is positioned on a same plane as the second face of the first semiconductor chip, and
a first side wall of the mold layer directly contacts the first semiconductor chip, and a second side wall of the mold layer opposite to the first side wall of the mold layer is aligned with a side wall of the second semiconductor chip.

* * * * *